United States Patent
Asano et al.

(10) Patent No.: US 7,675,770 B2
(45) Date of Patent: Mar. 9, 2010

(54) PHASE CHANGE MEMORY DEVICE

(75) Inventors: Isamu Asano, Tokyo (JP); Yukio Fuji, Tokyo (JP); Kiyoshi Nakai, Tokyo (JP); Tsuyoshi Kawagoe, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 639 days.

(21) Appl. No.: 11/349,959

(22) Filed: Feb. 9, 2006

(65) Prior Publication Data
US 2006/0176724 A1 Aug. 10, 2006

(30) Foreign Application Priority Data
Feb. 9, 2005 (JP) ............................ 2005-033271

(51) Int. Cl.
*G11C 11/00* (2006.01)
(52) U.S. Cl. .................. 365/163; 365/148; 365/158
(58) Field of Classification Search ................ 365/163, 365/148, 158, 189.01, 46, 63; 257/2–5
See application file for complete search history.

(56) References Cited

U.S. PATENT DOCUMENTS

| | | | |
|---|---|---|---|
| 5,307,304 A | 4/1994 | Saito et al. | |
| 6,567,296 B1 | 5/2003 | Casagrande et al. | |
| 6,590,807 B2 | 7/2003 | Lowrey | |
| 6,816,404 B2* | 11/2004 | Khouri et al. | 365/163 |
| 6,850,432 B2* | 2/2005 | Lu et al. | 365/163 |
| 6,909,129 B2 | 6/2005 | Kim et al. | |
| 6,937,505 B2 | 8/2005 | Morikawa | |
| 6,967,865 B2 | 11/2005 | Lee | |
| 6,990,004 B2 | 1/2006 | Iwata | |
| 7,009,277 B2* | 3/2006 | Yamaguchi | 257/536 |
| 7,064,975 B2 | 6/2006 | Iwata | |
| 7,071,485 B2 | 7/2006 | Takaura et al. | |
| 7,130,214 B2 | 10/2006 | Lee | |
| 7,136,299 B2* | 11/2006 | Chu et al. | 365/163 |
| 7,233,520 B2* | 6/2007 | Daley | 365/163 |
| 7,286,378 B2* | 10/2007 | Nazarian | 365/46 |

(Continued)

FOREIGN PATENT DOCUMENTS

CN 1571160 1/2005

(Continued)

OTHER PUBLICATIONS

Chinese Office Action, with Japanese Translation, issued in Chinese Patent Application No. CN 2006100064780, dated on Feb. 1, 2008.

(Continued)

*Primary Examiner*—David Lam
(74) *Attorney, Agent, or Firm*—McDermott Will & Emery LLP

(57) ABSTRACT

A phase change memory device, comprising a phase change memory device; a semiconductor substrate; a MOS transistor disposed at each intersection of a plurality of word lines and a plurality of bit lines arranged in a matrix form; a plurality of phase change memory elements for storing data of a plurality of bits, each formed on an upper area opposite to a diffusion layer of the MOS transistor in a phase change layer made of phase change material; a lower electrode structure for electrically connecting each of the plurality of phase change memory elements to the diffusion layer of the MOS transistor.

16 Claims, 21 Drawing Sheets

U.S. PATENT DOCUMENTS

| | | |
|---|---|---|
| 7,335,907 B2 * | 2/2008 | Terao et al. ............... 257/2 |
| 7,470,923 B2 | 12/2008 | Takaura et al. |
| 2003/0123271 A1 | 7/2003 | Iwata |
| 2005/0083730 A1 | 4/2005 | Iwata |
| 2008/0048166 A1 | 2/2008 | Takaura et al. |
| 2009/0250680 A1 | 10/2009 | Takaura et al. |

FOREIGN PATENT DOCUMENTS

| | | |
|---|---|---|
| JP | 2003-197876 | 7/2003 |
| JP | 2003-249073 | 9/2003 |
| JP | 2004-186553 | 7/2004 |
| JP | 2004-311015 | 11/2004 |
| JP | 2004-349504 | 12/2004 |
| WO | WO 03/085675 A2 | 10/2003 |
| WO | WO 2004/105039 A2 | 12/2004 |

OTHER PUBLICATIONS

Japanese Office Action issued in Japanese Patent Application No. 2005-033271, mailed Oct. 20, 2009.

* cited by examiner

PHASE CHANGE MEMORY DEVICE

BACKGROUND OF THE INVENTION

1. Field of the Invention

The present invention relates to a non-volatile semiconductor device which is constructed on a semiconductor substrate using phase change material and is capable of storing desired data.

2. Related Art

In recent years, non-volatile memory has been widely used to store data of portable device and the like. As next-generation non-volatile memory, attention is directed toward phase change memory using structural changes of phase change material. For example, the phase change memory has a structure in which a phase change layer is deposited on a semiconductor substrate using a chalcogenide based phase change material, and current is supplied to a predetermined region of the layer via an electrode. Such a structure causes the predetermined region of the phase change layer to change freely between its high-resistance amorphous state and low-resistance crystalline state, and using changes in resistance of the states, it is possible to rewritably store desired data (for example, see U.S. Pat. Nos. 6,590,807B2 and 6,567,296B1). In this case, it is possible to construct multi-bit phase change memory by integrating unit cells each composed of a single MOS transistor to supply power and a single phase change memory element.

However, in the aforementioned conventional phase change memory, since the current for rewriting data is sufficiently large, the gate width of the MOS transistor is required to be increased. The area of a unit cell in the phase change memory is determined by the gate width of the MOS transistor, and it is inevitable that the area is increased. In this case, the entire chip area increases as the storage capacity increases in the phase change memory, resulting in an obstacle to high integration.

SUMMARY OF THE INVENTION

It is an object of the present invention to provide a phase change memory device which has a structure in which a predetermined number of phase change memory elements are connected to a single MOS transistor on a semiconductor substrate, and thereby reduces the layout area per bit to be suitable for high integration.

An aspect of the present invention is a phase change memory device comprising: a semiconductor substrate; a MOS transistor disposed at each intersection of a plurality of word lines and a plurality of bit lines arranged in a matrix form; a plurality of phase change memory elements for storing data of a plurality of bits, each formed on an upper area opposite to a diffusion layer of said MOS transistor in a phase change layer made of phase change material; a lower electrode structure for electrically connecting each of said plurality of phase change memory elements to said diffusion layer of said MOS transistor.

According to the aspect of the invention, the entire phase change memory device is constructed in which one MOS transistor and a plurality of phase change memory elements constitute a unit configuration for storing data of a plurality of bits. Accordingly, since a plurality of phase change memory elements share one MOS transistor, it is possible to reduce the layout area per phase change memory element when the gate width of the MOS transistor is increased in order to supply sufficient current for rewriting data via a lower electrode, and a phase change memory device suitable for high integration can be realized.

In the present invention, said lower electrode structure may include one common plate disposed opposite to said plurality of phase change memory elements, one or more first plugs for connecting said diffusion layer of said MOS transistor and said common plate, and a plurality of second plugs for connecting said common plate and each of said plurality of phase change memory elements.

In the present invention, said phase change memory element may change between low-resistance crystalline state and high-resistance amorphous state by heat generated when supplying current to corresponding said second plug and is capable of rewriting data.

In the present invention, said plurality of second plugs may be arranged along a direction of gate width of said MOS transistor In the present invention, said plurality of second plugs may be arranged so that adjacent said phase change memory elements adjacent in a direction of gate width have an offset to each other in a direction of gate length.

The present invention may further comprise an upper electrode structure including a plurality of element selection lines for supplying current to each of said plurality of phase change memory elements separately.

In the present invention, said element selection line may be arranged so that an extension direction thereof is parallel to an extension of said bit line on said semiconductor substrate.

In the present invention, said upper electrode structure may be a multi-layer structure.

In the present invention, said lower electrode structure may be a multi-layer structure in addition to said upper electrode structure.

As described above, according to the present invention, a phase change layer is formed on a semiconductor substrate and current can be supplied to a unit configuration including one MOS transistor and a plurality of phase change memory elements via a lower electrode structure. Therefore, since the layout area per bit can be reduced when the gate width of the MOS transistor is increased in order to supply sufficient rewriting current for rewriting data to the plurality of phase change memory elements, it is possible to realize high integration of the phase change memory device.

BRIEF DESCRIPTION OF THE DRAWINGS

The above and other objects and features of the invention will appear more fully hereinafter from a consideration of the following description taken in connection with the accompanying drawing wherein one example is illustrated by way of example, in which.

DETAILED DESCRIPTION OF THE INVENTION

An embodiment of the invention will be specifically described below with reference to accompanying drawings. This embodiment describes a case in which the invention is applied to a phase change memory device which is a non-volatile semiconductor storage device using the phase change material.

Figure 1:
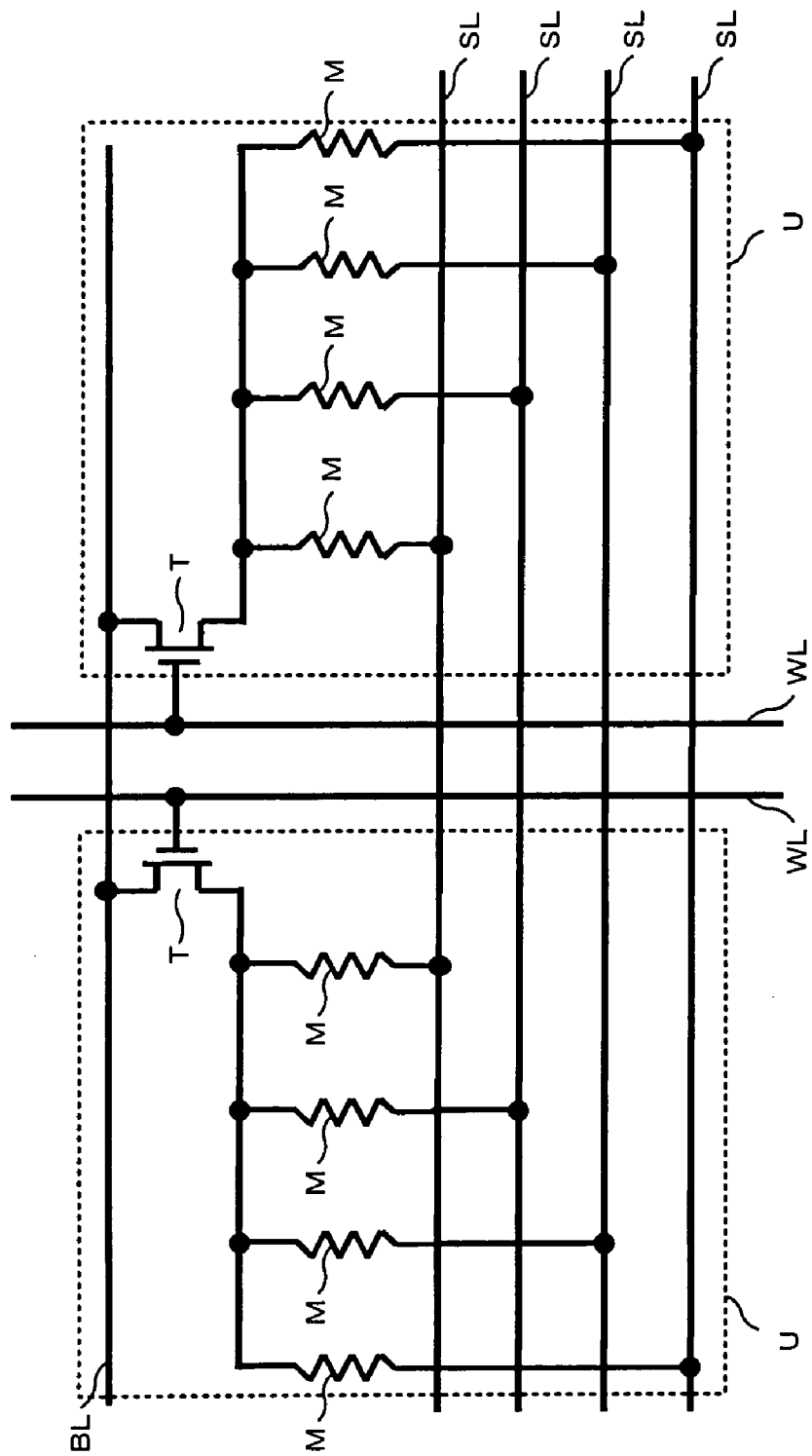
FIG. 1 is a view showing a basic circuit configuration which is a unit configuration of a phase change memory device of this embodiment.

Referring to FIG. 1, a basic circuit configuration which is a unit configuration of the phase change memory device of this embodiment will be described. In the circuit as shown in FIG. 1, one unit circuit U is composed of a MOS transistor T and four phase change memory elements M commonly connected to the transistor. The four phase change memory elements M are connected to respective different element selection lines SL and supplied with current separately. The entire circuit of the phase change memory device is configured by regularly arranging a large number of unit circuits U having the same configuration. FIG. 1 shows a circuit part including two unit circuits U of the entire circuit of the phase change memory device.

A word line WL is connected to the gate of the MOS transistor T. A bit line BL is connected to one source/drain diffusion layer of the MOS transistor T, the element selection lines SL is connected to the other source/drain diffusion layer, and phase change memory elements M are connected thereto via the element selection lines SL. Predetermined numbers of word lines WL and bit lines BL are provided respectively and are arranged in matrix form as a whole. The unit circuit U composed of one MOS transistor T and four phase change memory elements M is disposed at each intersection of the word lines WL and bit lines BL.

The phase change memory element M is formed, for example, using germanium, antimony and tellurium which are the chalcogenide based phase change material, and functions as a memory element (resistance) to rewritably store one-bit data corresponding to the high-resistance and low-resistance states. Accordingly, four phase change memory elements M connected to one MOS transistor T hold four-bit data. When rewriting data stored in the phase change memory element M, it is required to apply predetermined pulses to cause change between the high-resistance amorphous state and low-resistance crystalline state, and a control circuit for such application needs to be configured on the semiconductor substrate.

In addition, by separately controlling voltages on four element selection lines SL connected to the four phase change memory elements M, current flows from the four phase change memory elements M through the common MOS transistor T and the bit line BL. It is thereby possible to control the write/read operation individually on the four phase change memory elements M.

In the phase change memory device with the aforementioned configuration, it is necessary to increase the gate width of the MOS transistor T to such an extent that sufficient current can be supplied when rewriting each phase change memory element M, and thereby the layout area increases on the semiconductor substrate. However, in this embodiment, even when the gate width of one MOS transistor T is increased, since four phase change memory elements M share the MOS transistor T, the layout area per bit is small in the entire phase change memory device, and it is possible to implement a configuration advantageous to high integration.

Next, referring to FIGS. 2 to 19, a method of manufacturing the phase change memory device of this embodiment will be described, and thereafter a detailed device structure will be described.

Figure 2:
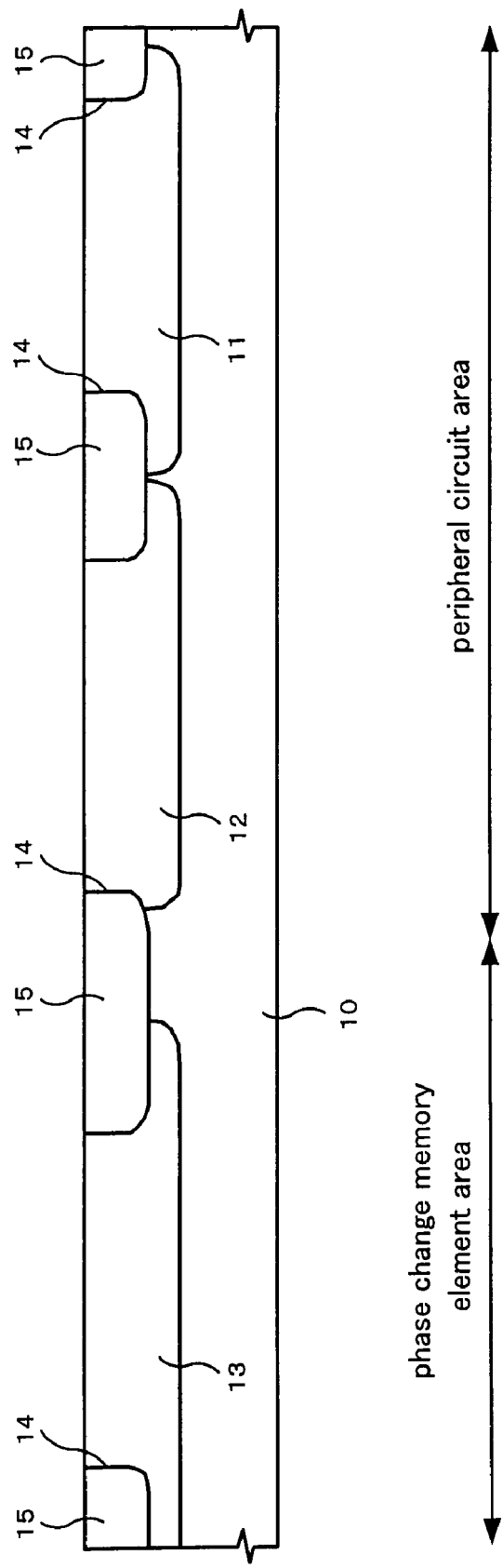
FIG. 2 is a cross-sectional view showing a first step in a method of manufacturing the phase change memory device of this embodiment.

First, as shown in FIG. 2, shallow trenches 14 are formed on a main surface of a semiconductor substrate 10 made of, for example, p-type silicon monocrystal. Then, isolation regions 15 are formed by embedding a silicon oxide film on the shallow trench 14. For example, the shallow trench 14 may have a depth of 0.3 µm, and the silicon oxide film may be formed on an inner wall of the trench by thermal oxidation method. In forming the isolation region 15, the silicon oxide film is further deposited, and polished by CMP (Chemical Mechanical Polishing) to be left only inside the shallow trench 14. Next, using a photoresist as a mask, phosphorus (P) ions are implanted by ion implantation to form an n-type well 11. Further, using a photoresist as a mask, boron (B) ions are implanted by ion implantation to form p-type wells 12 and 13.

As shown in FIG. 2, the cross-sectional structure of the phase change memory device includes both a phase change memory element area and a peripheral circuit area. Since the manufacturing process of the peripheral circuit area is common to that of general DRAM, FIGS. 3 to 19 described below illustrate mainly a structure of the phase change memory element area, while illustration of a structure of the peripheral circuit area is omitted.

Figure 3:
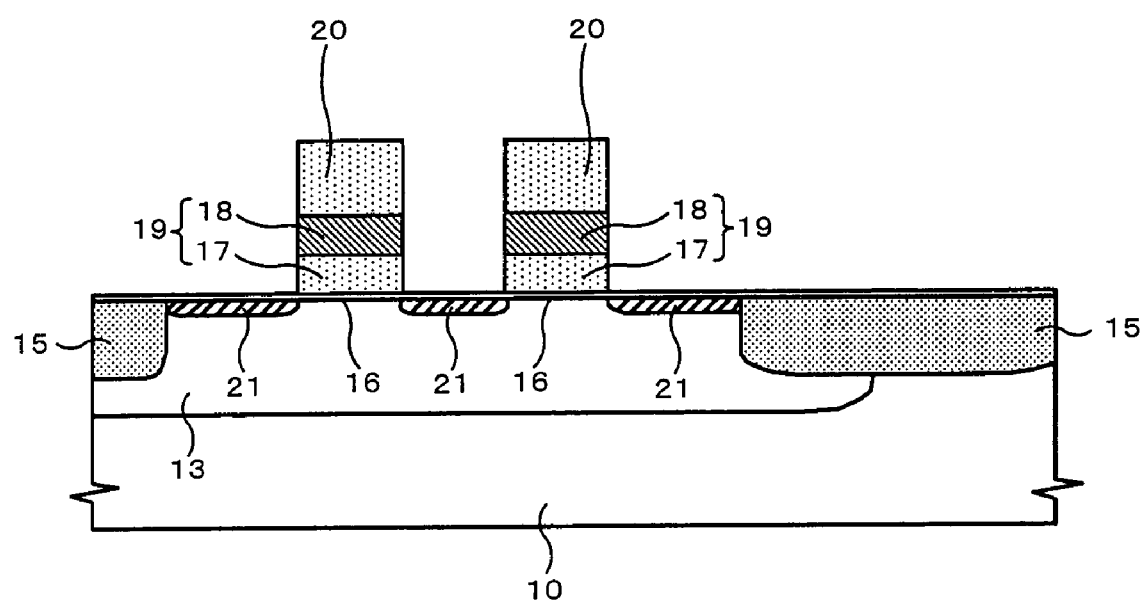
FIG. 3 is a cross-sectional view showing a step of forming gate electrodes 19 in a method of manufacturing the phase change memory device of this embodiment.

Next, as shown in FIG. 3, a gate insulating film 16 is formed on the p-type well 13 to be an active region by thermal oxidation. Then, a polysilicon film 17 is deposited on the main surface of the semiconductor substrate 10 with a thickness of 50 nm by CVD (Chemical Vapor Deposition), for example. Thereafter, a tungsten film 18 is deposited thereon with a thickness of 100 nm by sputtering, for example. In addition, the polysilicon film 17 can be deposited while introducing phosphorus (P) as impurities, for example. At this time, it is desired to insert a tungsten nitride (WN) film formed by sputtering, for example, between the polysilicon film 17 and the tungsten film 18 for the purpose of preventing a reaction therebetween.

Then, a silicon nitride film is deposited with a thickness of 200 nm, for example. Further, by patterning using photolithography technique and dry etching technique, each gate electrode 19 composed of the polysilicon film 17 and the tungsten film 18 is formed, and a cap insulating film 20 is formed on the electrode 19.

Next, using the cap insulating film 20, gate electrode 19 and photoresist (not shown) as a mask, for example, arsenic (As) or phosphorus (P) is implanted by ion implantation as impurities to form each impurity region 21. The impurity region 21 functions as the source or drain of the n-channel MOS transistor. Further, in the peripheral circuit area not shown, for example, boron (B) is implanted by ion implantation as impurities to form an impurity region functioning as a p-channel MOS transistor.

Figure 4:
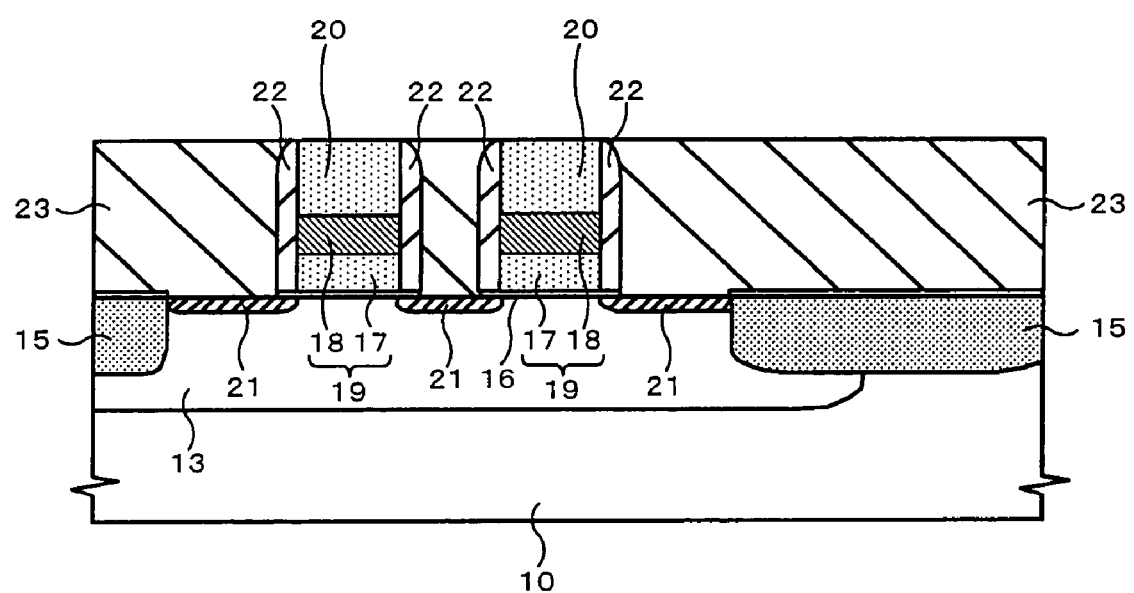
FIG. 4 is a cross-sectional view showing a step of forming silicon nitride film side walls 22a and an interlayer insulator 23 in a method of manufacturing the phase change memory device of this embodiment.

Next, as shown in FIG. 4, a silicon nitride film is deposited on the entire surface of the semiconductor substrate 10 with a thickness of 30 nm, for example (a state immediately after the film is formed is not shown). Thereafter, anisotropic dry etching is applied to the silicon nitride film, which remains only on side walls of the cap insulating films 20 and the gate electrode 19, and thus, each silicon nitride film side wall 22 is formed on the gate electrode 19.

Next a silicon oxide film with a thickness of 500 nm, for example, is formed by CVD, and its surface is polished to be flattened by CMP. Therefore, an interlayer insulator 23 is formed. At this time, as a silicon oxide film, a TEOS oxide film formed by CVD using TEOS (Tetra Ethoxy Silane) as material gas can be used. Further, it is possible to introduce predetermined amounts of boron (B) and phosphorus (P) into the silicon oxide film and then cause the silicon oxide film to reflow by applying heat treatment. Thereafter, CMP is also performed to improve the flatness, and the interlayer insulator 23 can be formed.

Figure 5:
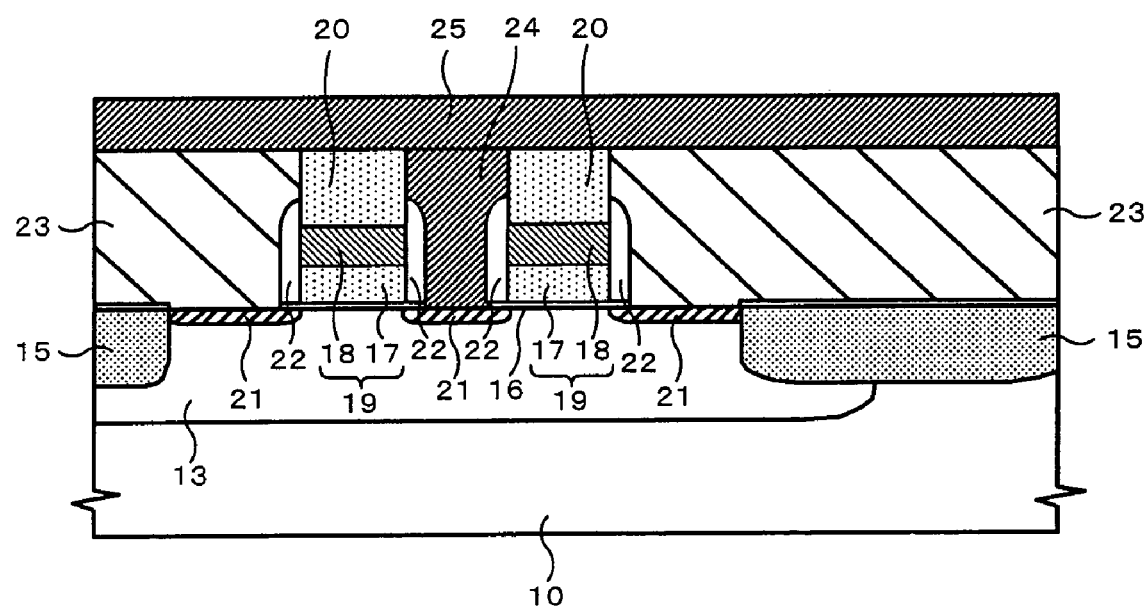
FIG. 5 is a cross-sectional view showing a step of opening bit line contacts 24 and forming a tungsten film 25 in a method of manufacturing the phase change memory device of this embodiment.

Next, as shown in FIG. 5, each bit line contact 24 is opened by using photolithography technique and dry etching technique. In this dry etching, by using a difference in etching rate between the silicon insulating film and the silicon nitride film, the contact 24 is formed in self align for the gate electrode 19 on conditions that the silicon nitride film side wall 22 and the cap insulating film 20 are hard to be etched.

Figure 6:
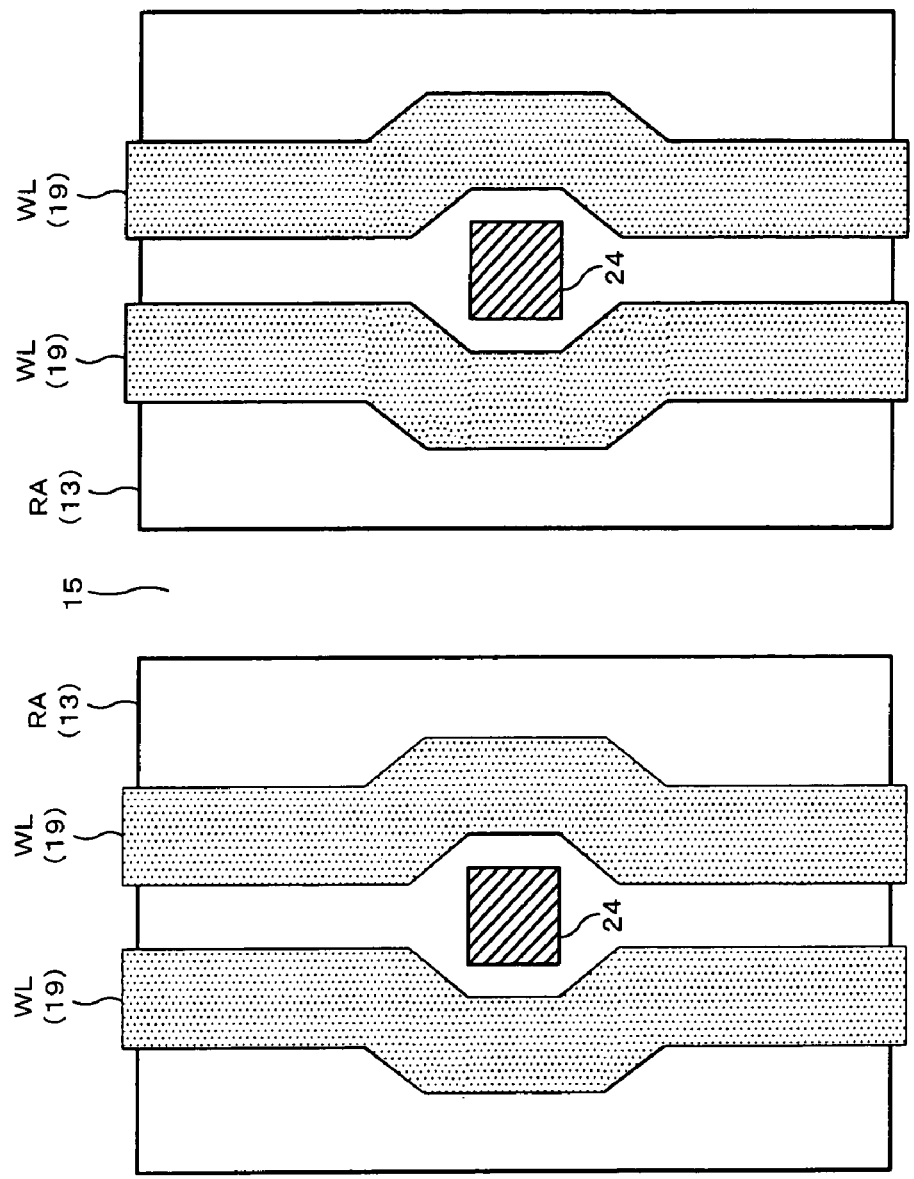
FIG. 6 is a plane layout showing a state in which two word lines WL are arranged in an active region RA in a method of manufacturing the phase change memory device of this embodiment.

FIG. 6 shows a plane layout of the phase change memory device in a state in which the gate electrodes 19 and opened bit line contacts 24 are formed. As shown in FIG. 6, active regions RA each with a rectangle pattern are regularly disposed while being spaced by the isolation region 15. Two gate electrodes 19 to be word lines WL are arranged in each active region RA, and a single bit line contact 24 is disposed at the central portion. The bit line contact 24 is used to connect the diffusion layer of a lower MOS transistor and the bit line BL (its manufacturing method will be described later), and the two word lines WL of the active region RA are thereby connected to the common bit line BL.

As shown in FIG. 6, two word lines WL in the active region RA are arranged in such a pattern that the lines go around the bit line contact 24. Accordingly, the spacing between the word lines WL is wide to some extent in portions close to the bit line contact 24. Meanwhile, in portions not close to the bit line contact 24, the two word lines WL can be arranged with minimum processing dimensions, thus being effective in reducing the layout area. In addition, the principal portion of the word line WL is patterned linearly, and photolithography can be performed readily even in process limitations.

Meanwhile, in FIG. 5, after opening the bit line contacts 24, for example, a tungsten film 25 is formed on the main surface of the semiconductor substrate 10. At this time, it is desired to form beforehand a silicide film made of high melting point metal such as cobalt (Co), titanium (Ti), tantalum (Ta), tungsten (W) or the like in order to guarantee excellent electrical conduction between the bit line contact 24 and the source/drain region in contact with the bit line contact 24 in the impurity region 21.

In addition, it is necessary to improve the flatness of the main surface of the semiconductor substrate 10 in the processes subsequent to opening of the bit line contact 24. Therefore, for example, it is possible that the deposited tungsten film 25 is polished by CMP to form a metal plug, and a tungsten film is deposited thereon again to process a desired bit line by photolithography technique and dry etching technique.

Figure 7:
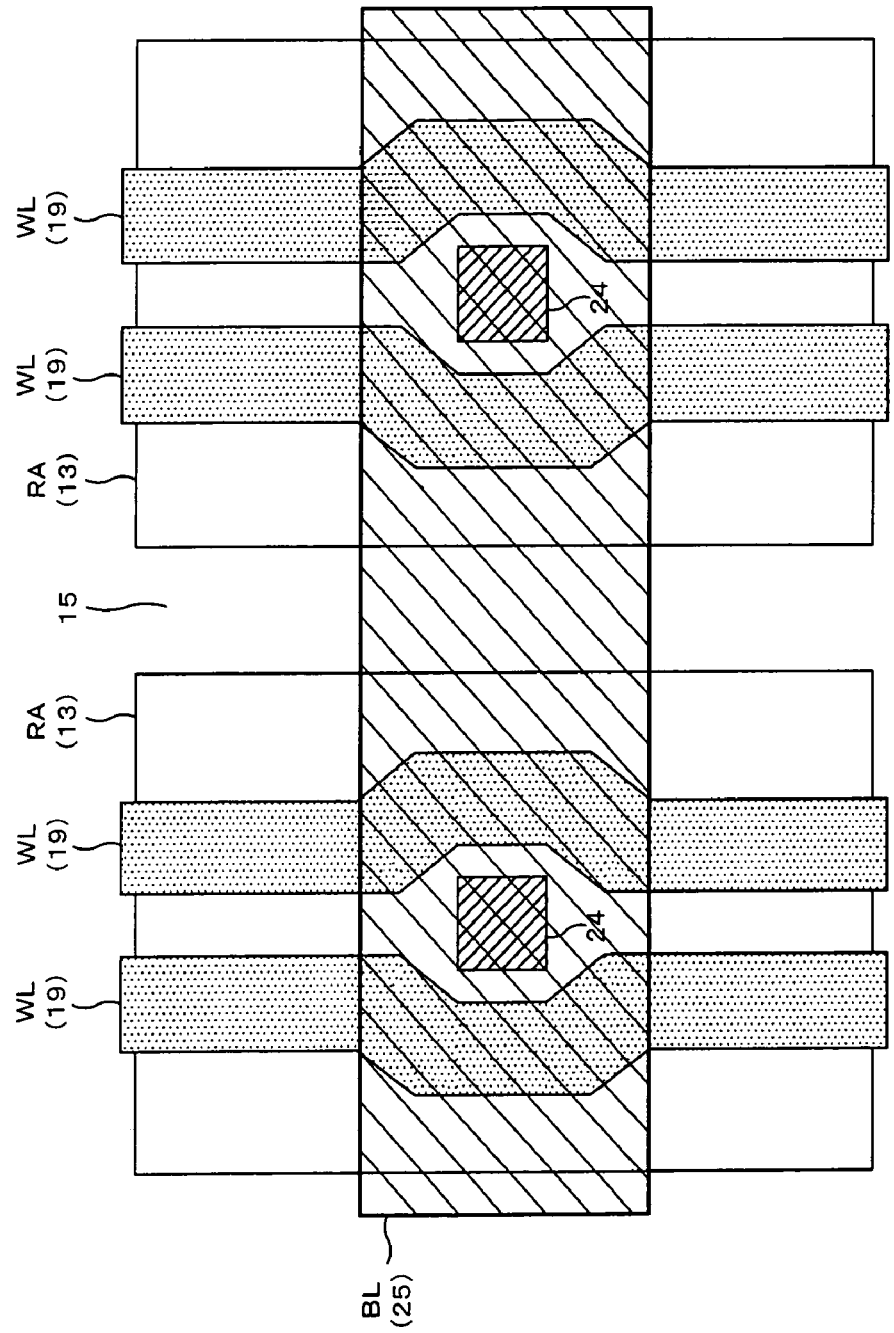
FIG. 7 is a plane layout showing a state in which a bit line BL is formed in a method of manufacturing the phase change memory device of this embodiment.

FIG. 7 shows a plane layout of the phase change memory device in a state in which the bit line BL is formed using the tungsten film 25. As shown in FIG. 7, the bit line BL is arranged in the direction connecting adjacent bit line contacts 24 in adjacent active regions RA (p-type wells 13). Accordingly, the word line WL (gate electrode 19) and the bit line BL (tungsten film 25) are arranged in directions perpendicular to each other. By such an arrangement, the circuit portion related to the bit lines BL and the circuit portion related to the word lines WL can be integrated on different ends of the semiconductor substrate 10, enabling configuration of an efficient plane layout.

Figure 8:
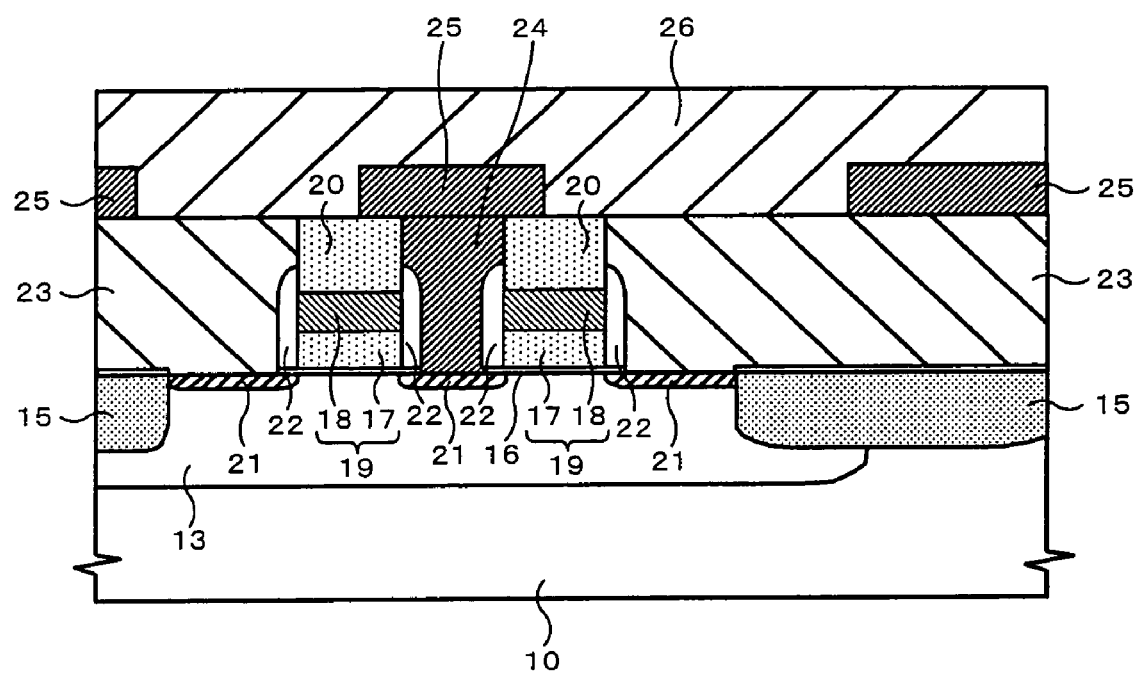
FIG. 8 is a cross-sectional view showing a step of forming an interlayer insulator 26 in a method of manufacturing the phase change memory device of this embodiment.

Next, as shown in FIG. 8, an interlayer insulator 26 is formed on the main surface of the semiconductor substrate 10. The above-mentioned TEOS oxide film may be used as the interlayer insulator 26. At this time, the above-mentioned process of polishing by CMP can be added to improve the flatness.

Figure 9:
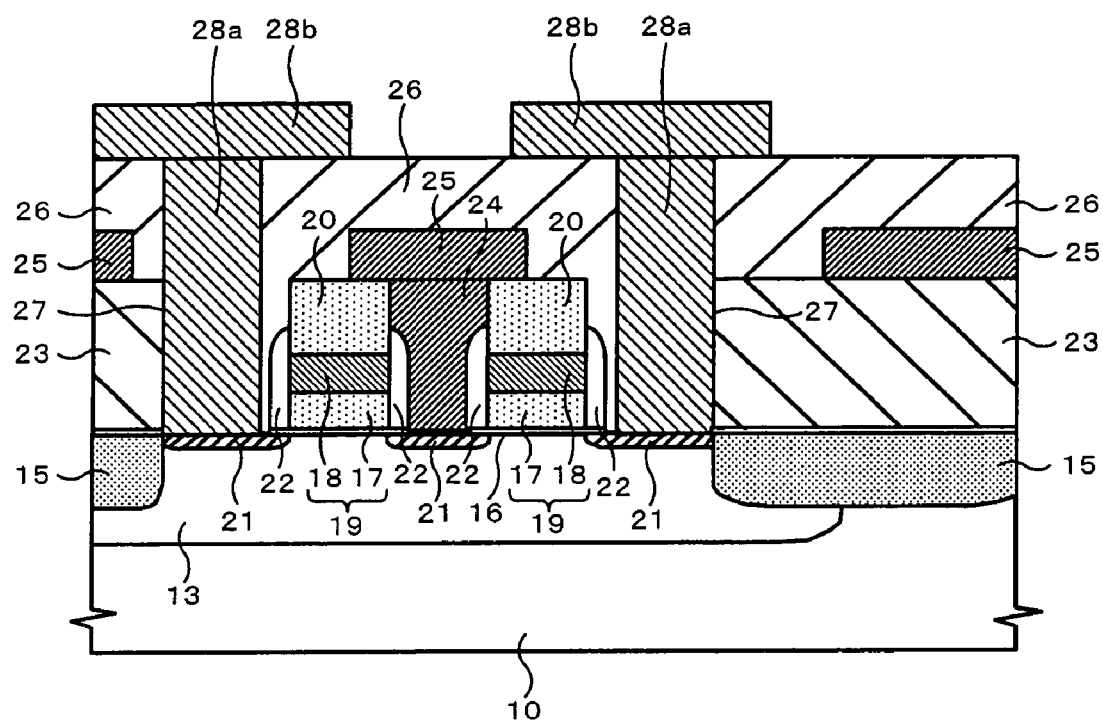
FIG. 9 is a cross-sectional view showing a step of opening lower electrode plate contacts 27 and forming plugs 28a lower electrode plates 28b in a method of manufacturing the phase change memory device of this embodiment.

Next, as shown in FIG. 9, each lower electrode plate contact 27 is opened by using photolithography technique and dry etching technique. In this dry etching, by using a difference in etching rate between the silicon insulating film and the silicon nitride film, the contact 27 is formed in self align for the gate electrode 19 on conditions that the silicon nitride film side wall 22 formed on the side of the gate electrode 19 and the cap insulating film 20 are hard to be etched.

Figure 10:
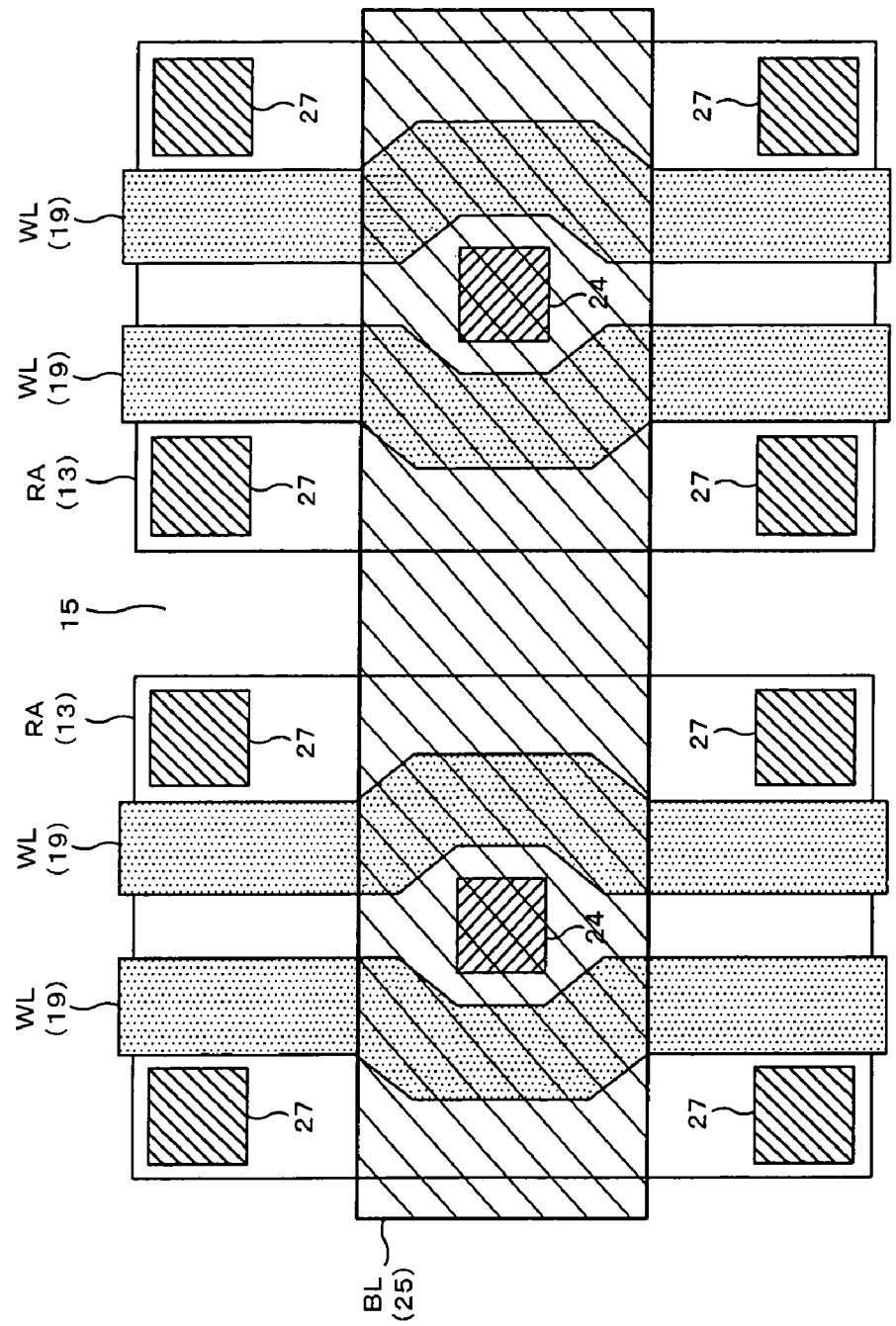
FIG. 10 is a plane layout showing a state in which lower electrode plate contacts 27 is opened in a method of manufacturing the phase change memory device of this embodiment.

FIG. 10 shows a plane layout of the phase change memory device in a state in which the lower electrode plate contacts 27 are opened. Each lower electrode plate contact 27 is formed over the exposed active region RA exposed to the outside of two parallel word lines WL. In addition, FIG. 10 shows an example in which four lower electrode plate contacts 27 are disposed at four corners of each active region RA. The lower electrode plate contacts 27 are necessary for the structure of wiring between the phase change memory element and the source/drain diffusion layer of the MOS transistor, and therefore, disposing a large number of contacts is desired to reduce the resistance component of the wiring. However, it is possible to construct the phase change memory device of this embodiment by forming at least one lower electrode plate contact 27 in each active region RA.

As shown in FIG. 9, each plug 28a (corresponding to a first plug of the invention) is formed in the opened lower electrode plate contact 27. The plug 28a may be formed by forming a tungsten film by CVD and then polishing by CMP, for example. Subsequently a tungsten film, for example, is further deposited, and using photolithography technique and dry etching technique, each lower electrode plate 28a (corresponding to a common plate of the invention) is formed. In addition, it is desired to form beforehand a silicide film made of high melting point metal such as cobalt (Co), titanium (Ti), tantalum (Ta), tungsten (W) or the like in order to guarantee excellent electric conduction between the plug 28a and each under layer in contact with the plug 28a.

Figure 11:
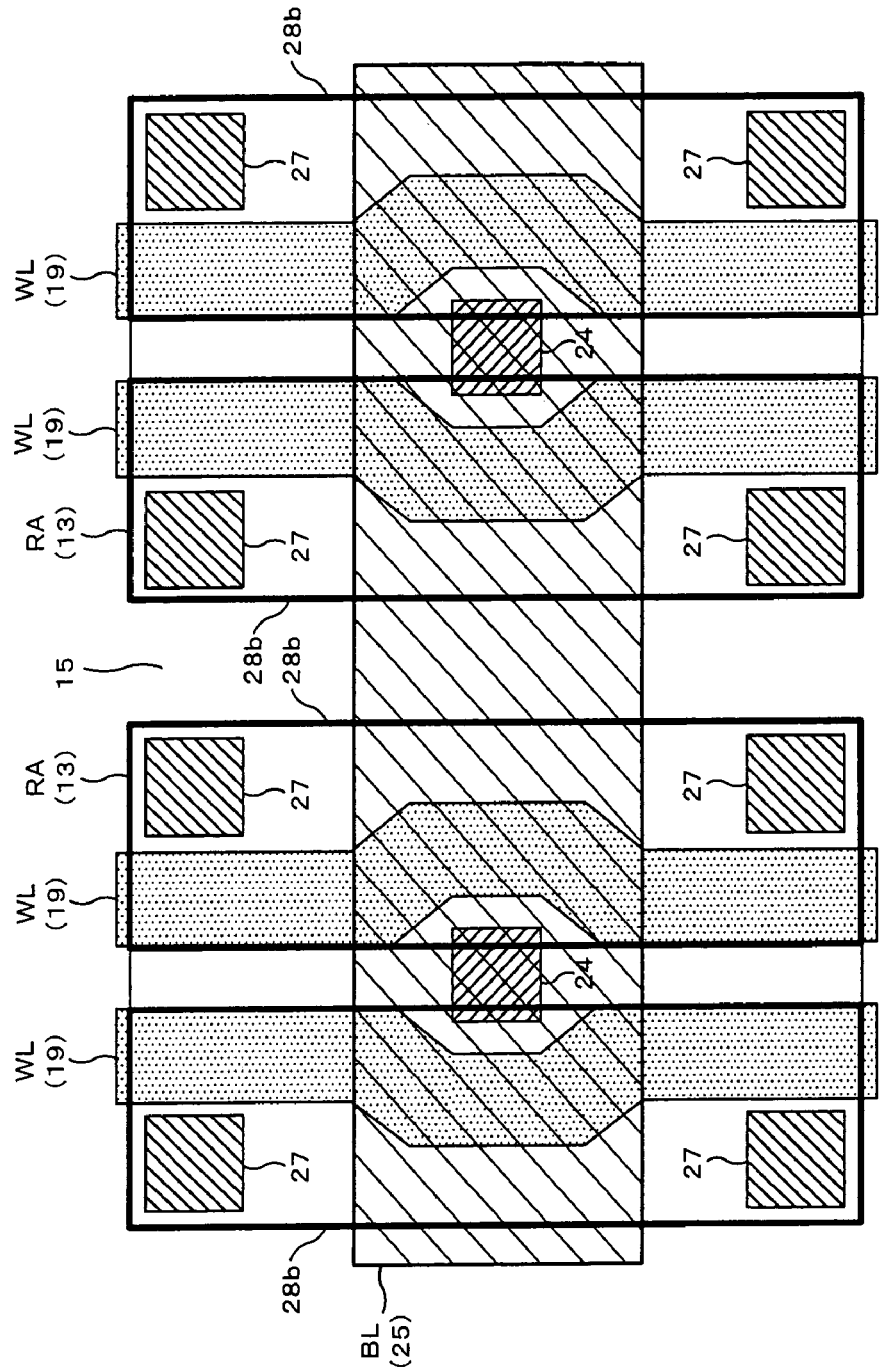
FIG. 11 is a plane layout showing a state in which lower electrode plates 28b is formed in a method of manufacturing the phase change memory device of this embodiment.

FIG. 11 shows a plane layout of the phase change memory device in a state in which the lower electrode plates 28b are formed. Two lower electrode plates 28b are disposed in each active region RA, and each of the plates 28 is connected to two of the four lower electrode plate contacts 27 as described above. It is thereby possible to connect phase change memory elements formed in the subsequent process to the source/drain diffusion layer of the same MOS transistor. However, it is possible to construct the phase change memory device of this embodiment by connecting the lower electrode plate 28b to at least one lower electrode plate contact 27.

Figure 12:
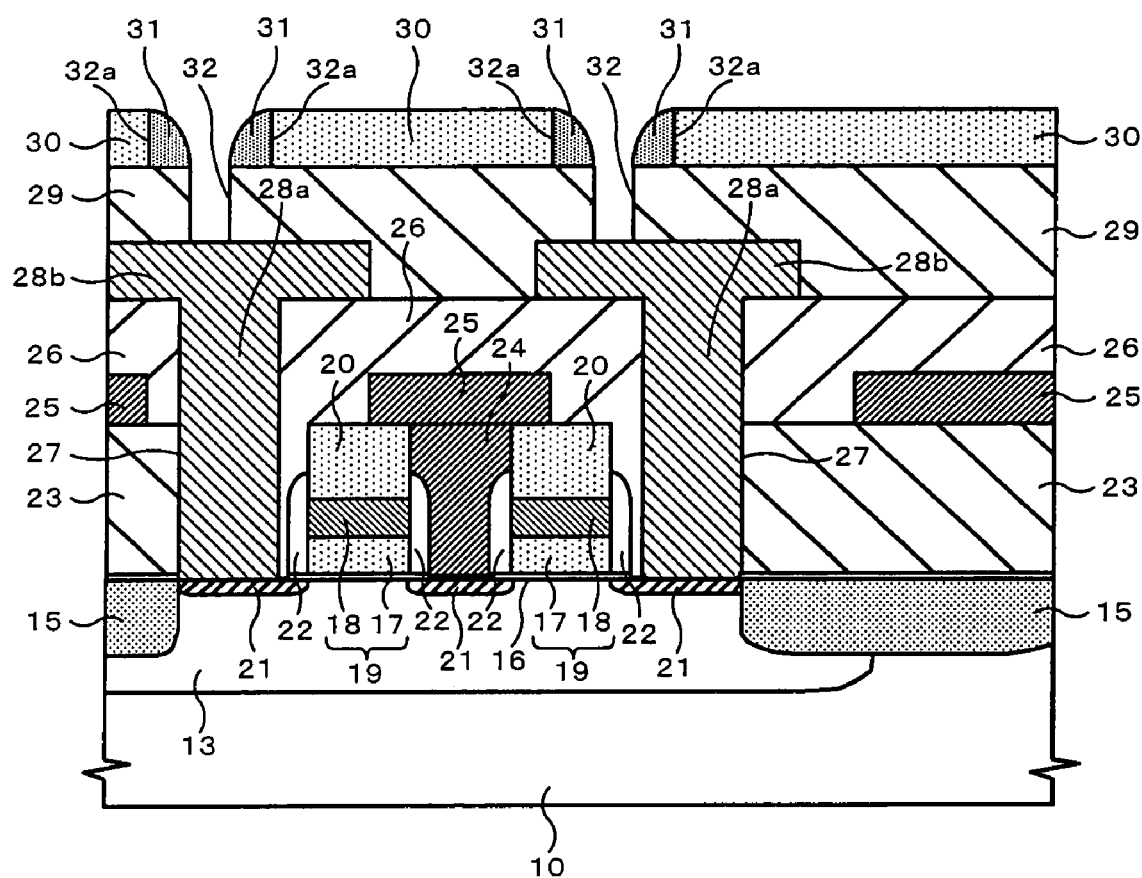
FIG. 12 is a cross-sectional view showing a step of opening lower electrode contacts 32 in a method of manufacturing the phase change memory device of this embodiment.

Next, as shown in FIG. 12, lower electrode contacts 32 are opened using photolithography technique and dry etching technique. An insulating film 29 is first formed on the main surface of the semiconductor substrate 10, and a hard mask 30 is further formed thereon. Then, lower electrode contacts 32a are opened in the hard mask 30, and the similar film is formed on the main surface of the semiconductor substrate 10. Anisotropic dry etching is applied to this film to form each side wall spacer 31 on the side wall of the opening portion of the lower electrode contact 32a. It is possible to construct a small lower electrode of the phase change memory element by forming the side wall spacer 31, which is useful for improving the heating efficiency. Finally, using the hard mask 30 and side wall spacer 31 as a mask, the lower electrode contacts 32 are opened by using dry etching technique. It is thereby possible to form the lower electrode contact 32 with a diameter smaller than the opening diameter of the lower electrode contact 32a.

Figure 13:
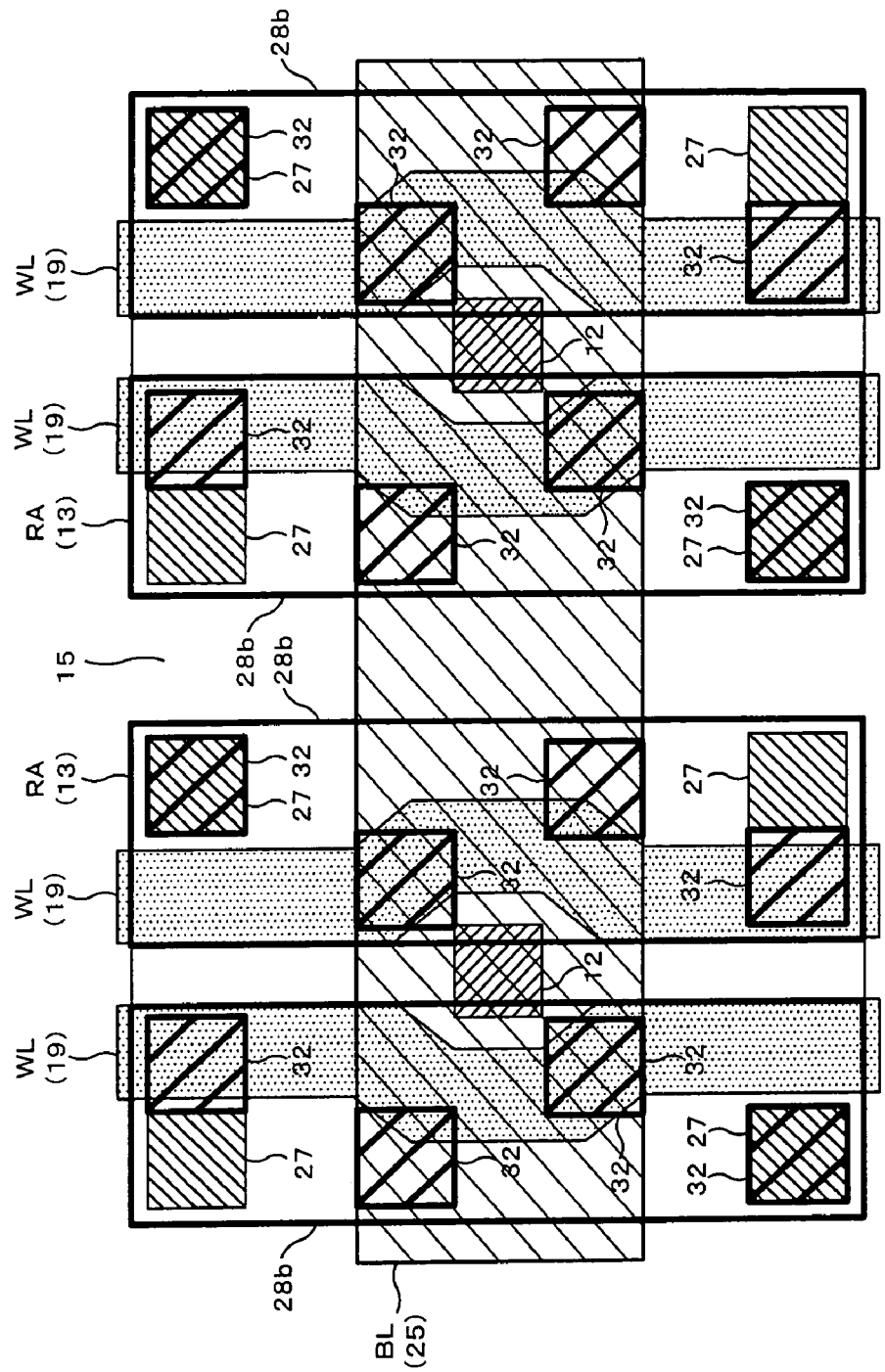
FIG. 13 is a plane layout showing a state in which lower electrode contacts 32 are opened in a method of manufacturing the phase change memory device of this embodiment.

FIG. 13 shows a plane layout of the phase change memory device in a state in which the lower electrode contacts 32 are opened. Each lower electrode plate 28b is connected to four lower electrode contacts 32. As shown in FIG. 13, the four lower electrode contacts 32 corresponding to a single lower electrode plate 28b are not arranged in a straight line but have an arrangement in which the lower electrode contacts 32 are alternately offset in the lateral direction. On the precondition that a distance between adjacent lower electrode contacts 32 is of the minimum processing dimension, in the case of the arrangement with an alternate offset, it is possible to reduce the entire length of the four lower electrode contacts 32 as compared with the straight-line arrangement, thus being effective in decreasing the layout area.

Figure 14:
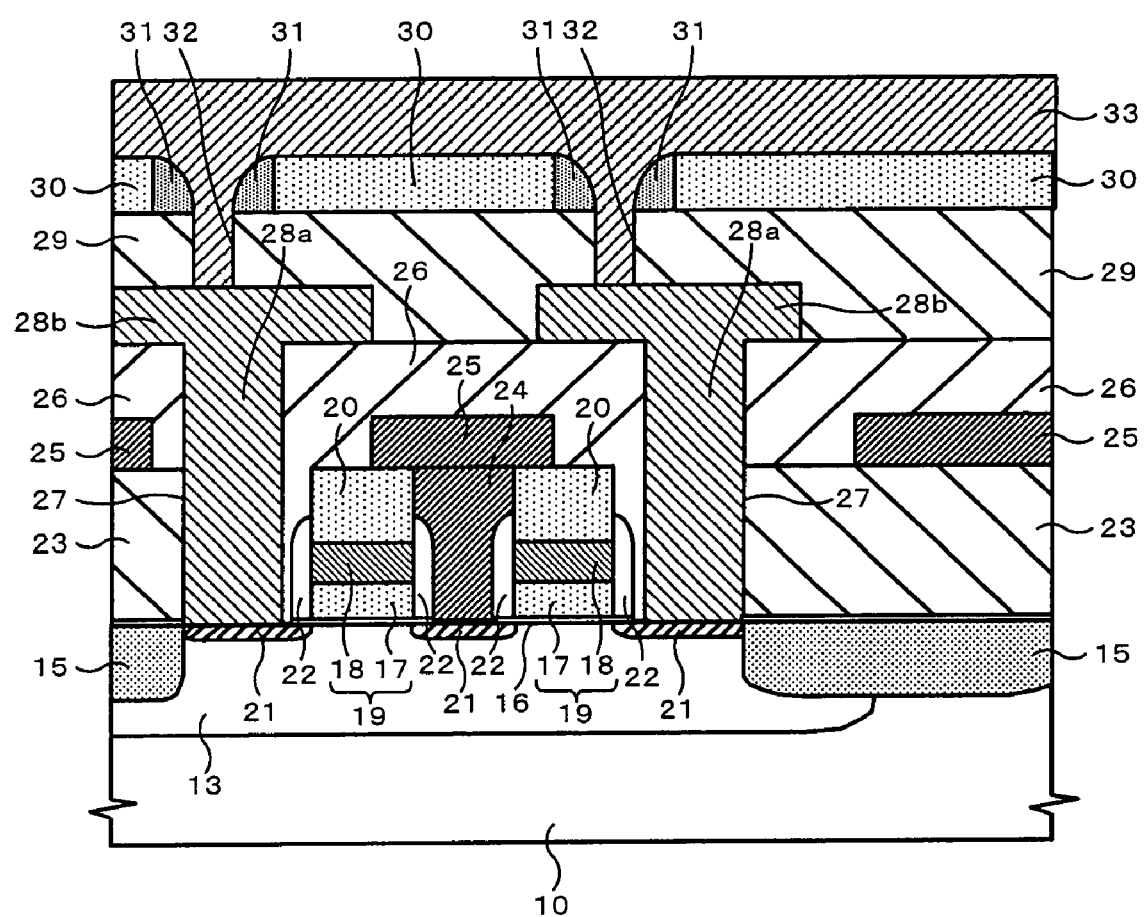
FIG. 14 is a cross-sectional view showing a step of depositing a tungsten film 33 in a method of manufacturing the phase change memory device of this embodiment.

Next, as shown in FIG. 14, a tungsten film 33, for example, is deposited on the entire surface of the semiconductor substrate 10 as a conductive film to be a lower electrode. For example, CVD may be used to deposit the tungsten film 33.

Figure 15:
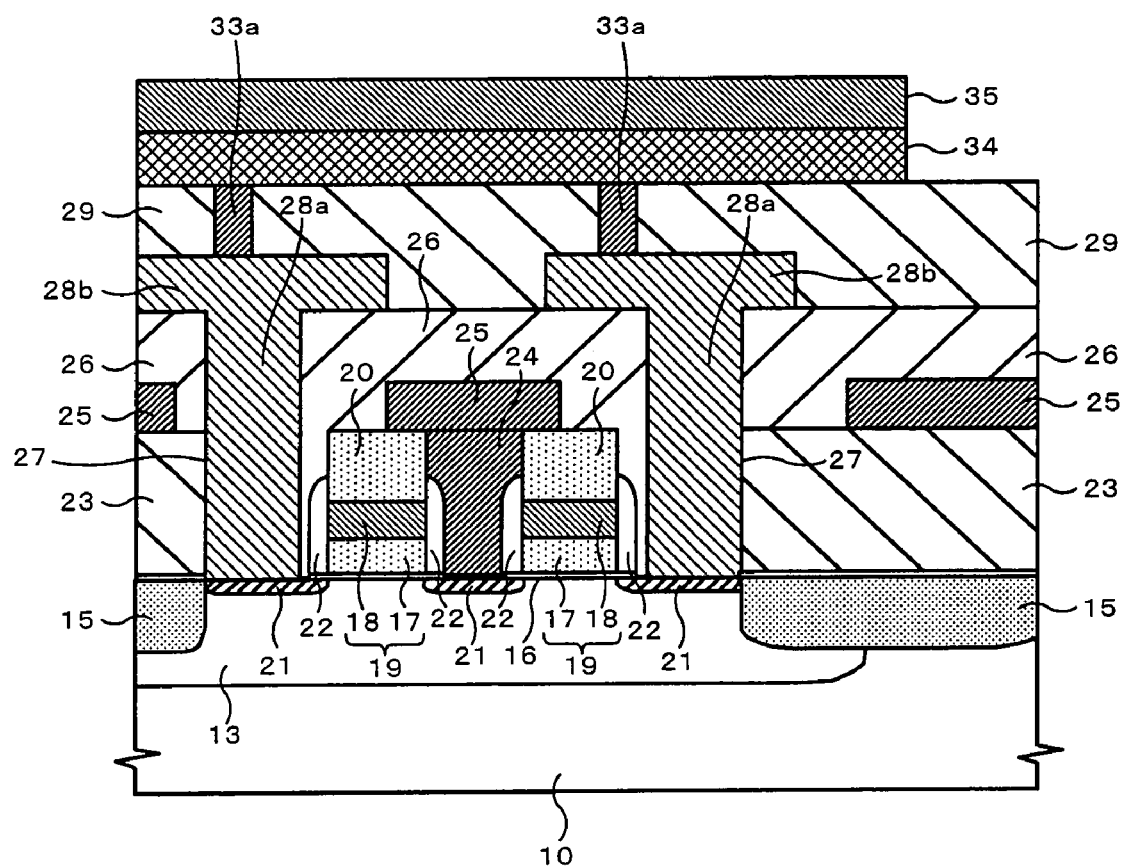
FIG. 15 is a cross-sectional view showing a step of forming lower electrode plugs 33a and depositing a chalcogenide film 34 and an upper electrode film 35 in a method of manufacturing the phase change memory device of this embodiment.

Next, as shown in FIG. 15, the deposited tungsten film 33 is polished by CMP, for example, to form lower electrode plugs 33a (corresponding to a second plug of the invention). Each lower electrode plug 33a generates heat when current is supplied, and thereby causes the phase change memory element to change its structure due to an increase in temperature. As material for the lower electrode plug 33a, high-resistance material is more preferable in terms of heating, and for example, as well as using tungsten, it is preferable to use high melting point metal or its nitride such as titanium nitride (TiN), tantalum nitride (TaN), tungsten nitride (WN), titanium aluminum nitride (TiAlN) or the like, or silicide nitride film (for example, TiSiN).

Next, a chalcogenide film 34 which is a phase change material and an upper electrode film 35 are deposited on the entire surface of the semiconductor substrate 10 by sputtering, for example. The chalcogenide film 34 is obtained, for example, by depositing $Ge_2Sb_2Te_5$ with a thickness ranging from 50 nm to 200 nm, and the upper electrode film 35 is obtained, for example, by depositing a tungsten film with a thickness of 50 nm. Thereafter, the chalcogenide film 34 and the upper electrode film 35 are processed together using photolithography technique and dry etching technique, and thereby patterning is performed for element selection lines SL to supply current to a desired phase change memory element.

In addition, as the chalcogenide film 34, material can be used which contain two or more of germanium (Ge), antimony (Sb), tellurium (Te), and selenium (Se). Further, as material for the upper electrode film 35, high-resistance material is more preferable in terms of heating, and for example, it is preferable to use high melting point metal or its nitride such as tungsten (W), titanium nitride (TiN), tantalum nitride (TaN), tungsten nitride (WN), titanium aluminum nitride (TiAlN) or the like, or silicide nitride film (for example, TiSiN).

Figure 16:
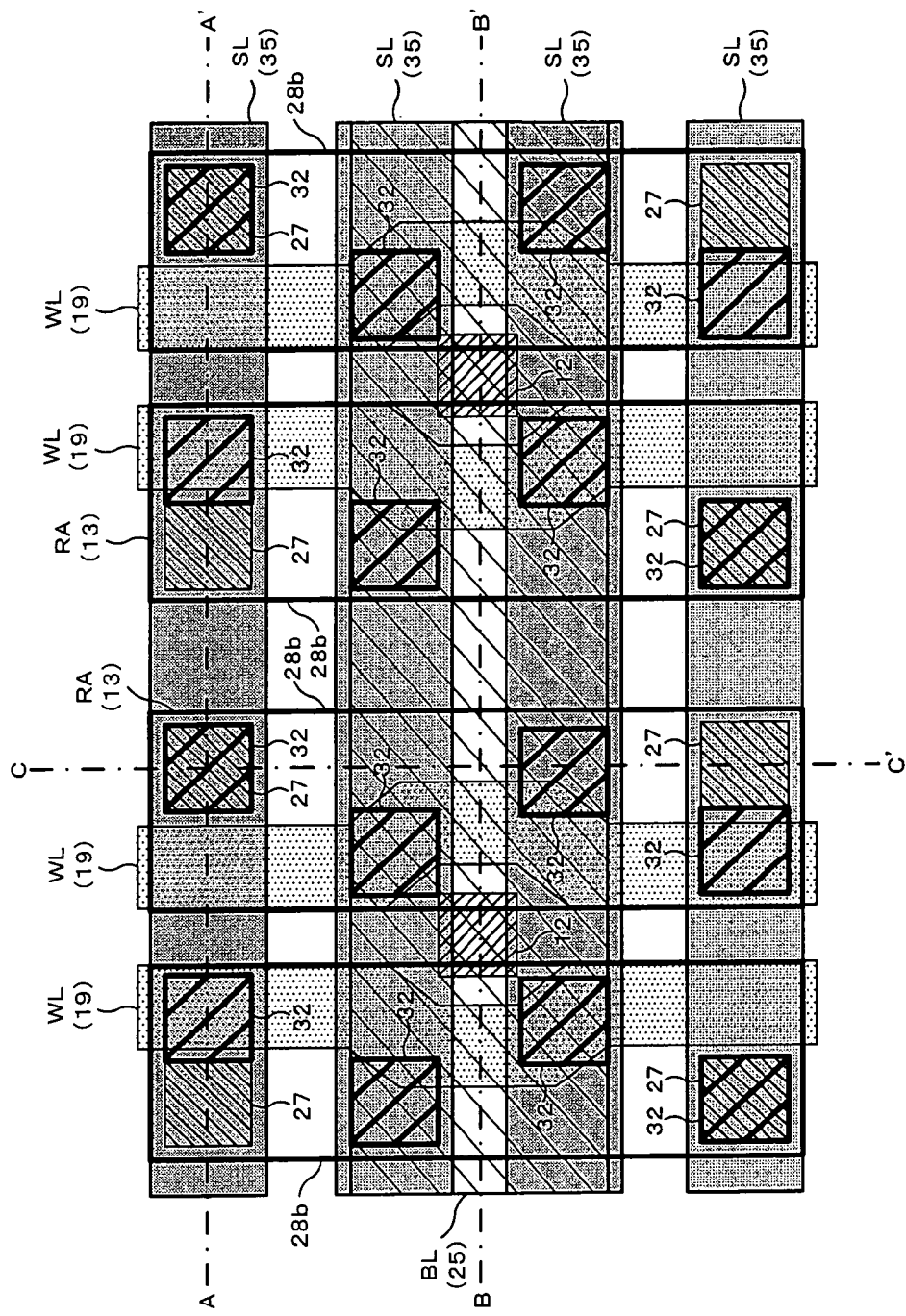
FIG. 16 is a plane layout showing a state in which element selection lines SL are patterned in a method of manufacturing the phase change memory device of this embodiment.

FIG. 16 shows a plane layout of the phase change memory device in a state in which element selection lines SL are patterned corresponding to the integrally formed chalcogenide film 34 and upper electrode film 35. Each element selection line SL is arranged so that its extension direction is the same as that of the bit line BL and perpendicular to that of the word line WL. In this embodiment, four phase change memory elements sharing one MOS transistor are separately connected to respective different element selection lines SL. By this, a portion of a control circuit connected to the element selection line SL can be integrated on the end different from that of the circuit potion with a large scale which is related to the word line WL, enabling configuration of a more efficient plane layout.

Figure 17:
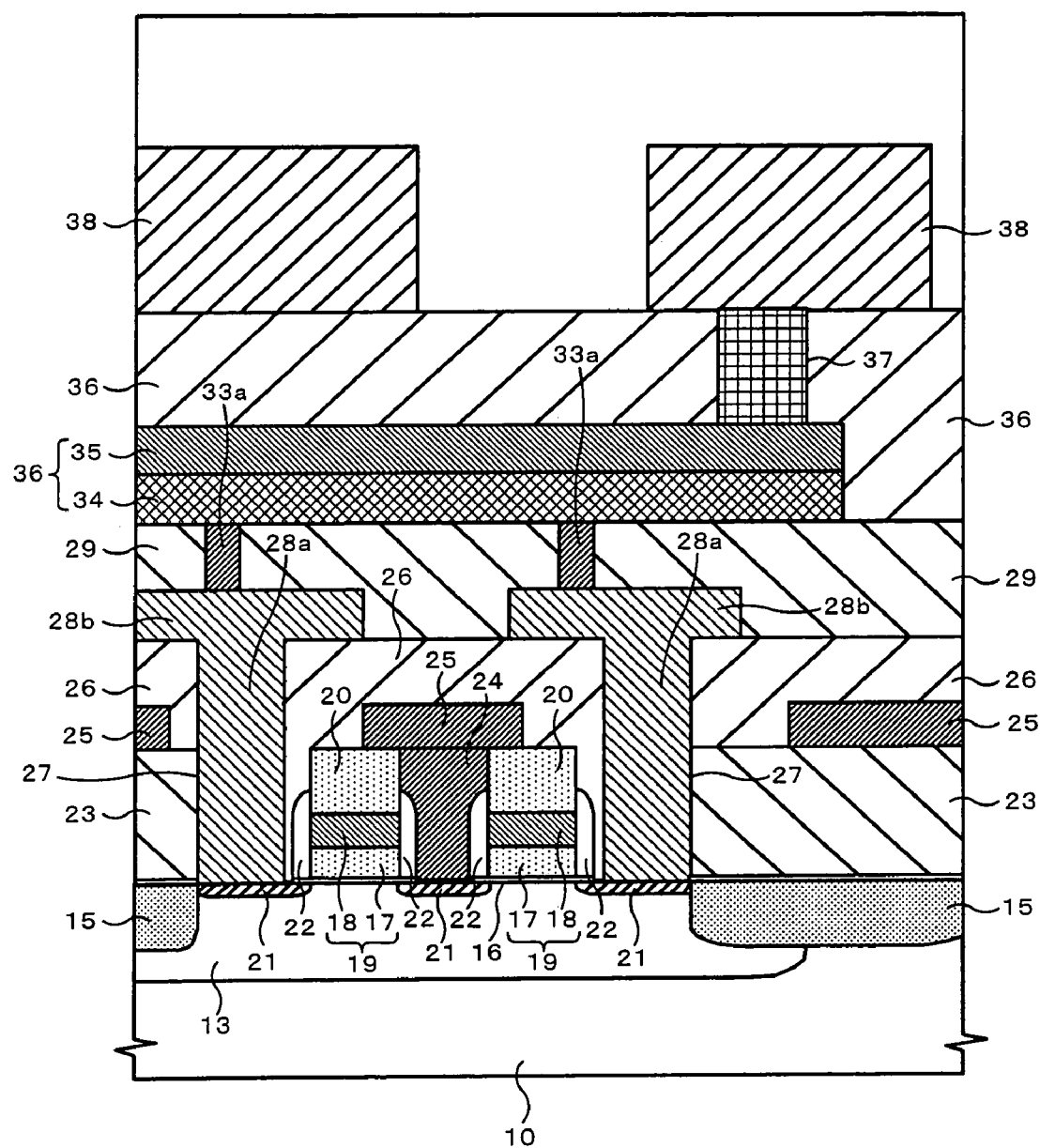
FIG. 17 is a cross-sectional view showing a step of depositing an interlayer insulator 36 and forming connection holes 37 and second-layer wiring 38 in a method of manufacturing the phase change memory device of this embodiment.

Next, as shown in FIG. 17, an interlayer insulator 36 is deposited on the entire surface of the semiconductor substrate 10. For example, a silicon oxide film formed by plasma deposition can be used as the interlayer insulator 36. In this case, in order to prevent step height due to the element selection lines SL, for example, it is desired to polish the surface by CMP to flatten.

Further, second-layer wiring 38 is formed. The second-layer wiring 38 and the element selection line SL or tungsten film 25b in which bit lines BL and the like are formed are connected via connection holes 37. The second-layer wiring 38 can be formed by stacking layers of titanium nitride (TiN), aluminum (Al) and titanium nitride, for example. Each connection hole 37 can be formed by stacking layers of titanium (Ti), titanium nitride and tungsten, for example. It is possible to further provide third-layer wiring or more wiring layers (not shown) over the second-layer wiring 38 via interlayer insulators.

Figures 18A, 18B:
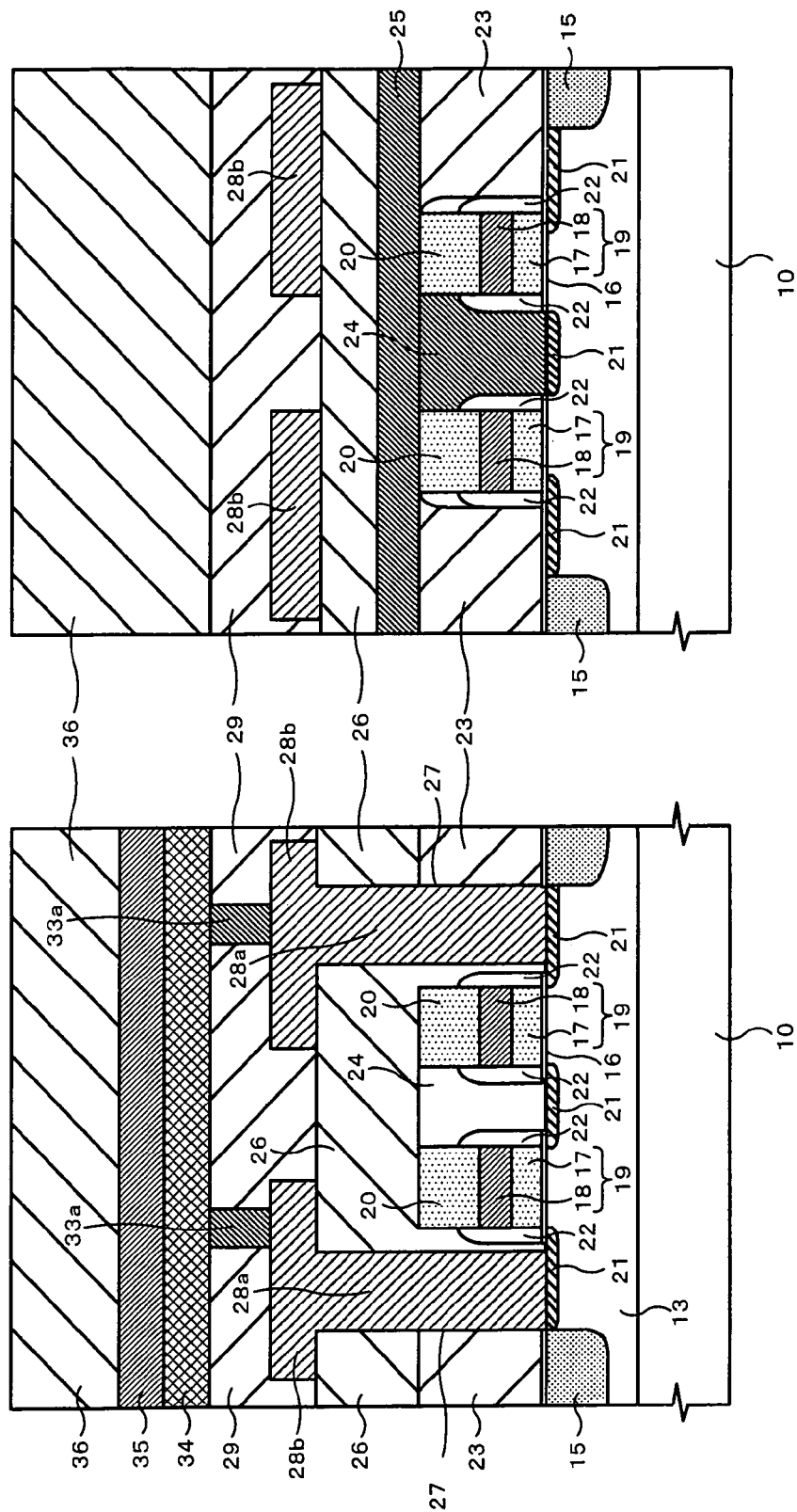
FIG. 18A is a structural view of A-A' corresponding to one of cross sections perpendicular to the word lines WL in FIG. 16.
FIG. 18B is a structural view of B-B' corresponding to the other of cross sections perpendicular to the word lines WL in FIG. 16.
Figure 19:
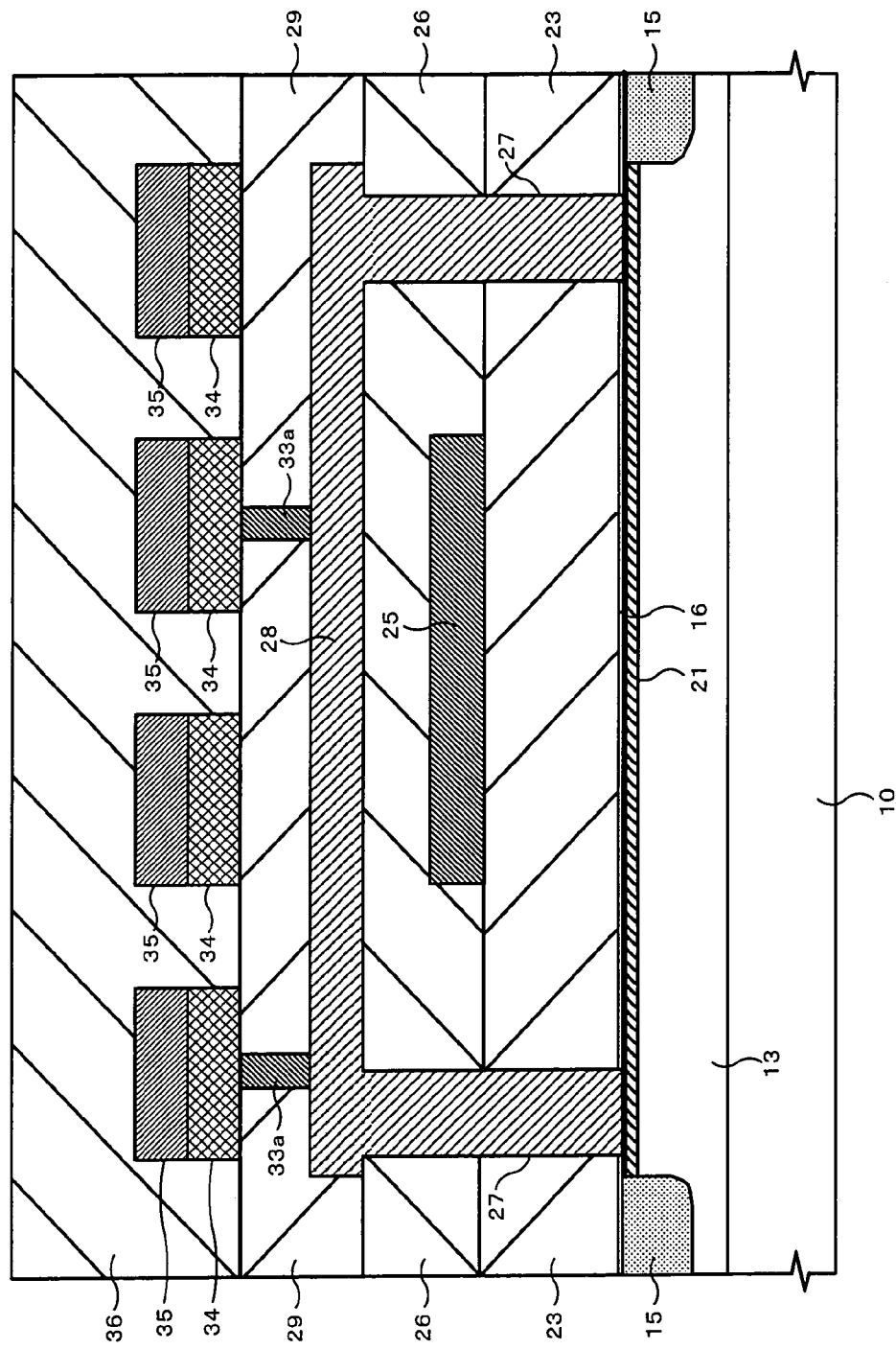
FIG. 19 is a structural view of C-C' corresponding to a cross section parallel to the word lines WL in FIG. 16.

A device structure of the phase change memory device of this embodiment is completed by the aforementioned processes. Herein, detailed cross-sectional structures are shown which are related to the completed phase change memory device. Corresponding to two cross sections (A-A' section and B-B' section) perpendicular to the word lines WL in FIG. 16, FIG. 18A shows a structural view of A-A' section, and FIG. 18B shows a structural view of B-B' section. And, corresponding to C-C' section parallel to the word lines WL in FIG. 16, FIG. 19 shows a structural view of C-C' section. In addition, cross-sectional structural views of FIGS. 2 to 17 are shown, including the A-A' section and B-B' section.

Figure 20:
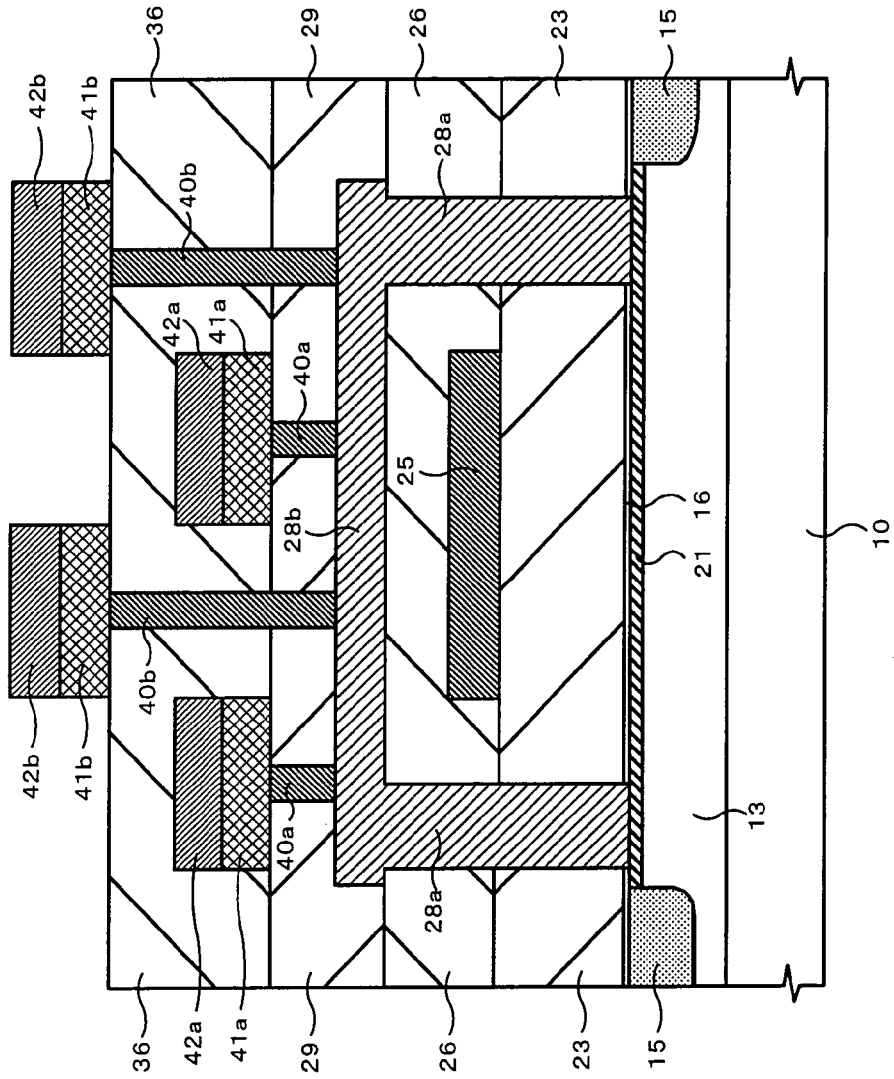
FIG. 20 is a cross-sectional structural view of a first modification of this embodiment.

The phase change memory device of this embodiment is not limited to the above-mentioned structure, and has various modifications. FIG. 20 is a cross-sectional structural view of a first modification of this embodiment, and corresponds to the structural view of C-C' section in FIG. 19 in this embodiment. In the first modification, the device is formed by two-layer including a first layer made of chalcogenide films 41a connected to lower electrode plugs 40a and upper electrode films 42a, and a second layer made of chalcogenide films 41b connected to lower electrode plugs 40b and upper electrode films 42b. By such a structure, it is possible to decrease the area required to arrange element selection lines SL. As a result, the entire layout area can be reduced corresponding to reduction in the area per bit in the phase change memory device.

Figure 21:
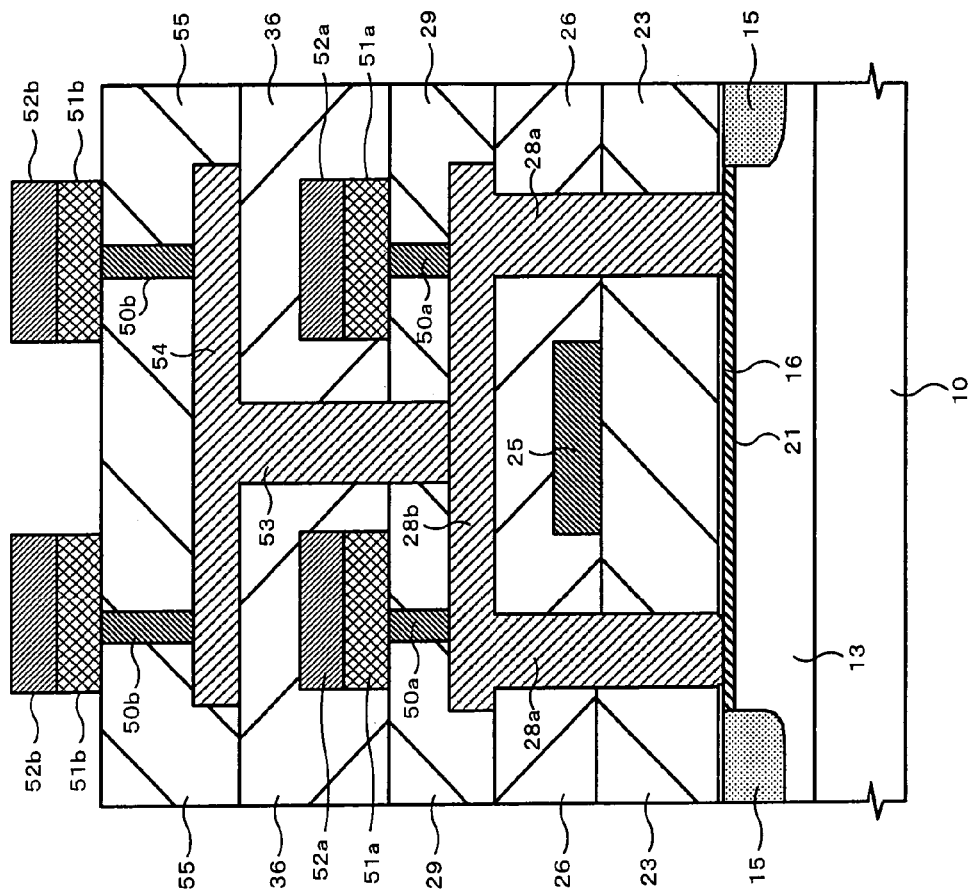
FIG. 21 is a cross-sectional structural view of a second modification of this embodiment.

FIG. 21 is a cross-sectional structural view of a second modification of this embodiment, and as in the first modification, corresponds to the structural view of C-C' section in FIG. 19. In the second modification, a first layer made of chalcogenide films 51a connected to lower electrode plugs 50a and upper electrode films 52a is the same as in the first modification, but a structure of a second layer is different from that in the first modification. That is, a lower electrode plate 54 of the second layer is configured over the lower electrode plate 28b via a plug 53, and an interlayer insulator 55 is deposited. Then, the second layer including chalcogenide films 51b connected to lower electrode plugs 50b and upper electrode films 52b is configured. Thus, by forming the structure of the two-layer including the lower electrode plates 28b and 54, the entire layout area can be reduced corresponding to reduction in area per bit in the phase change memory device.

In addition, the first and second modifications both describe the two-layer structure, but the number of layers can be increased to configure a multi-layer structure.

In the foregoing, the present invention is specifically described based on the embodiment. However, the invention is not limited to the above-mentioned embodiment, and is capable of being carried out with various changes without departing from the scope of the subject matter. For example, the embodiment describes the case of using the chalcogenide based phase change material as the phase change memory element, but the invention is widely applicable to cases of using other phase change materials enabling the same functions. Further, structures of the electrode and the MOS transistor in the phase change memory device of the embodiment are not limited to the structures of the embodiment, and various forms can be adopted.

The present invention is not limited to the above described embodiments, and various variations and modifications may be possible without departing from the scope of the present invention.

This application is based on the Japanese Patent application No. 2005-033271 filed on Feb. 9, 2005, entire content of which is expressly incorporated by reference herein.

What is claimed is:

1. A phase change memory device, comprising:
   a semiconductor substrate;
   a MOS transistor disposed at an intersection of a word line and a bit line;
   multiple phase change memory elements electrically connected to one diffusion layer of said MOS transistor, for each of which read and write operations can be individually controlled; and
   a lower electrode structure electrically connecting each of said multiple phase change memory elements to said one diffusion layer, including one common plate disposed opposite to said plurality of phase change memory elements, one or more first plugs connecting said diffusion layer of said MOS transistor to said common plate, and a plurality of second plugs connecting said common plate to said plurality of phase change memory elements, respectively.

2. The phase change memory device according to claim 1, wherein said phase change memory element changes between low-resistance crystalline state and high-resistance amorphous state by heat generated when supplying current to corresponding said second plug and is capable of rewriting data.

3. The phase change memory device according to claim 2, wherein said plurality of second plugs is arranged along a direction of gate width of said MOS transistor.

4. The phase change memory device according to claim 1, wherein said plurality of second plugs is arranged along a direction of gate width of said MOS transistor.

5. The phase change memory device according to claim 4, wherein said plurality of second plugs is arranged so that said phase change memory elements adjacent in a direction of gate width have an offset to each other in a direction of gate length.

6. A phase change memory device, comprising:
   a semiconductor substrate;
   a MOS transistor disposed at an intersection of a word line and a bit line;
   multiple phase change memory elements electrically connected to one diffusion layer of said MOS transistor, for each of which read and write operations can be individually controlled;
   a lower electrode structure for electrically connecting each of said multiple phase change memory elements to said one diffusion layer, and
   an upper electrode structure including a plurality of element selection lines for supplying current to each of said plurality of phase change memory elements separately.

7. The phase change memory device according to claim 6, wherein said element selection line is arranged so that an extension direction thereof is parallel to an extension of said bit line on said semiconductor substrate.

8. The phase change memory device according to claim 6, wherein said upper electrode structure is a multi-layer structure.

9. The phase change memory device according to claim 8, wherein said lower electrode structure is a multi-layer structure in addition to said upper electrode structure.

10. A phase change memory device, comprising:
a MOS transistor;
a plurality of phase change elements commonly connected to one diffusion layer of said MOS transistor;
a plurality of element selection lines;
a word line connected to a gate of said MOS transistor; and
a bit line connected to another diffusion layer of said MOS transistor,
wherein said plurality of phase change memory elements are respectively connected to different said element selection lines.

11. The phase change memory device according to claim 10, wherein said word line and said bit line are arranged orthogonal to each other, and said plurality of element selection lines extend in a same direction as said bit line.

12. A device, comprising:
a transistor formed over a semiconductor substrate having a first diffusion layer and a second diffusion layer;
a first insulating film formed over the transistor, the first diffusion layer and the second diffusion layer;
a first conductive plate formed on the first insulating film;
a first conductive plug formed in the first insulating film and extending from the first conductive plate to the first diffusion layer;
a second insulating film formed on the first conductive plate;
a plurality of first phase change materials formed on the second insulating film; and
a plurality of second conductive plugs each formed in the second insulating film and extending through the second insulating film from a corresponding one of the first phase change materials to the first conductive plate.

13. The device according to claim 12, further comprising:
a third insulating film formed on the second insulating film;
a second phase change material formed on the third insulating film; and
a third conductive plug formed in the second and the third insulating film and extending from the second phase change material to the first conductive plate.

14. The device according to claim 12, further comprising:
a third insulating film formed on the second insulating film;
a second conductive plate formed on the third insulating film;
a third conductive plug formed in the third insulating film and extending from the second conductive plate to the first conductive plate;
a fourth insulating film formed on the third conductive plate;
a second phase change material formed on the fourth insulating film; and
a fourth conductive plug formed in the fourth insulating film and extending from the second phase change material to the second conductive plate.

15. The device according to claim 12, further comprising at least one additional conductive plug formed in the first insulating film and extending from the first conductive plate to the first diffusion layer.

16. The device according to claim 12, further comprising:
a third insulating film formed over the transistor, the first diffusion layer and the second diffusion layer and formed below the first insulating film;
a first conductive film formed on the third insulating film, coupled to the second diffusion layer and elongated along a first direction; and
a plurality of second conductive films each formed on a corresponding one of the first phase change materials and elongated along the first direction.

* * * * *